(12) United States Patent
Akai et al.

(10) Patent No.: US 11,476,355 B2
(45) Date of Patent: Oct. 18, 2022

(54) SEMICONDUCTOR DEVICE

(71) Applicant: DENSO CORPORATION, Kariya (JP)

(72) Inventors: Tomoki Akai, Kariya (JP); Yuma Kagata, Kariya (JP); Masaru Senoo, Kariya (JP); Jun Okawara, Kariya (JP)

(73) Assignee: DENSO CORPORATION, Kariya (JP)

( * ) Notice: Subject to any disclaimer, the term of this patent is extended or adjusted under 35 U.S.C. 154(b) by 45 days.

(21) Appl. No.: 17/197,308

(22) Filed: Mar. 10, 2021

(65) Prior Publication Data

US 2021/0202725 A1 Jul. 1, 2021

Related U.S. Application Data

(63) Continuation of application No. PCT/JP2019/033935, filed on Aug. 29, 2019.

(30) Foreign Application Priority Data

Sep. 11, 2018 (JP) .............................. JP2018-169878

(51) Int. Cl.
*H01L 29/739* (2006.01)
*H01L 29/861* (2006.01)

(52) U.S. Cl.
CPC ........ *H01L 29/7397* (2013.01); *H01L 29/861* (2013.01)

(58) Field of Classification Search
CPC .......................... H01L 29/7397; H01L 29/861
USPC ........................................................ 257/140
See application file for complete search history.

(56) References Cited

U.S. PATENT DOCUMENTS

| 2005/0045960 | A1 | 3/2005 | Takahashi |
| 2007/0069287 | A1 | 3/2007 | Takahashi |
| 2012/0043581 | A1 | 2/2012 | Koyama et al. |
| 2012/0132954 | A1* | 5/2012 | Kouno ................ H01L 29/8611 257/140 |
| 2012/0181575 | A1 | 7/2012 | Pfirsch |
| 2014/0027814 | A1 | 1/2014 | Pfirsch |
| 2016/0111529 | A1 | 4/2016 | Hirabayashi et al. |
| 2016/0141400 | A1 | 5/2016 | Takahashi |
| 2016/0293595 | A1 | 10/2016 | Narazaki et al. |
| 2016/0359027 | A1 | 12/2016 | Soeno |
| 2018/0108737 | A1* | 4/2018 | Naito .................. H01L 29/0834 |
| 2019/0252533 | A1* | 8/2019 | Naito ...................... H01L 29/36 |
| 2019/0252534 | A1* | 8/2019 | Murakawa .............. H01L 29/78 |
| 2020/0098747 | A1* | 3/2020 | Tamura ................ H01L 29/868 |

FOREIGN PATENT DOCUMENTS

JP 2013-008779 A 1/2013

* cited by examiner

*Primary Examiner* — Igwe U Anya
(74) *Attorney, Agent, or Firm* — Posz Law Group, PLC

(57) ABSTRACT

A semiconductor device having IGBT, FWD and separate cell regions in a common semiconductor substrate, includes: a drift layer; a base layer; trench gate structures; an emitter region; a collector layer; a cathode layer; a first electrode; and a second electrode. The IGBT region having a first gate electrode in first and second IGBT trenches with a grid pattern is on the collector layer, and the FWD region with a second gate electrode in first and second FWD trenches with a grid pattern is on the cathode layer.

11 Claims, 11 Drawing Sheets

SEMICONDUCTOR DEVICE

CROSS REFERENCE TO RELATED APPLICATION

The present application is a continuation application of International Patent Application No. PCT/JP2019/033935 filed on Aug. 29, 2019, which designated the U.S. and claims the benefit of priority from Japanese Patent Application No. 2018-169878 filed on Sep. 11, 2018. The entire disclosures of all of the above applications are incorporated herein by reference.

TECHNICAL FIELD

The present disclosure relates to a semiconductor device in which an insulated gate bipolar transistor (hereinafter, referred to as IGBT) element having an insulated gate structure and a free-wheel diode (hereinafter, referred to as FWD) element are formed on a common semiconductor substrate.

BACKGROUND

Conventionally, as a switching element used in inverters and the like, for example, a semiconductor device has been proposed in which an IGBT region having an IGBT element and an FWD region having an FWD element are formed on a common semiconductor substrate.

SUMMARY

According to an example, a semiconductor device having IGBT, FWD and separate cell regions in a common semiconductor substrate, includes: a drift layer; a base layer; trench gate structures; an emitter region; a collector layer; a cathode layer; a first electrode; and a second electrode. The IGBT region having a first gate electrode in first and second IGBT trenches with a grid pattern is on the collector layer, and the FWD region with a second gate electrode in first and second FWD trenches with a grid pattern is on the cathode layer.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
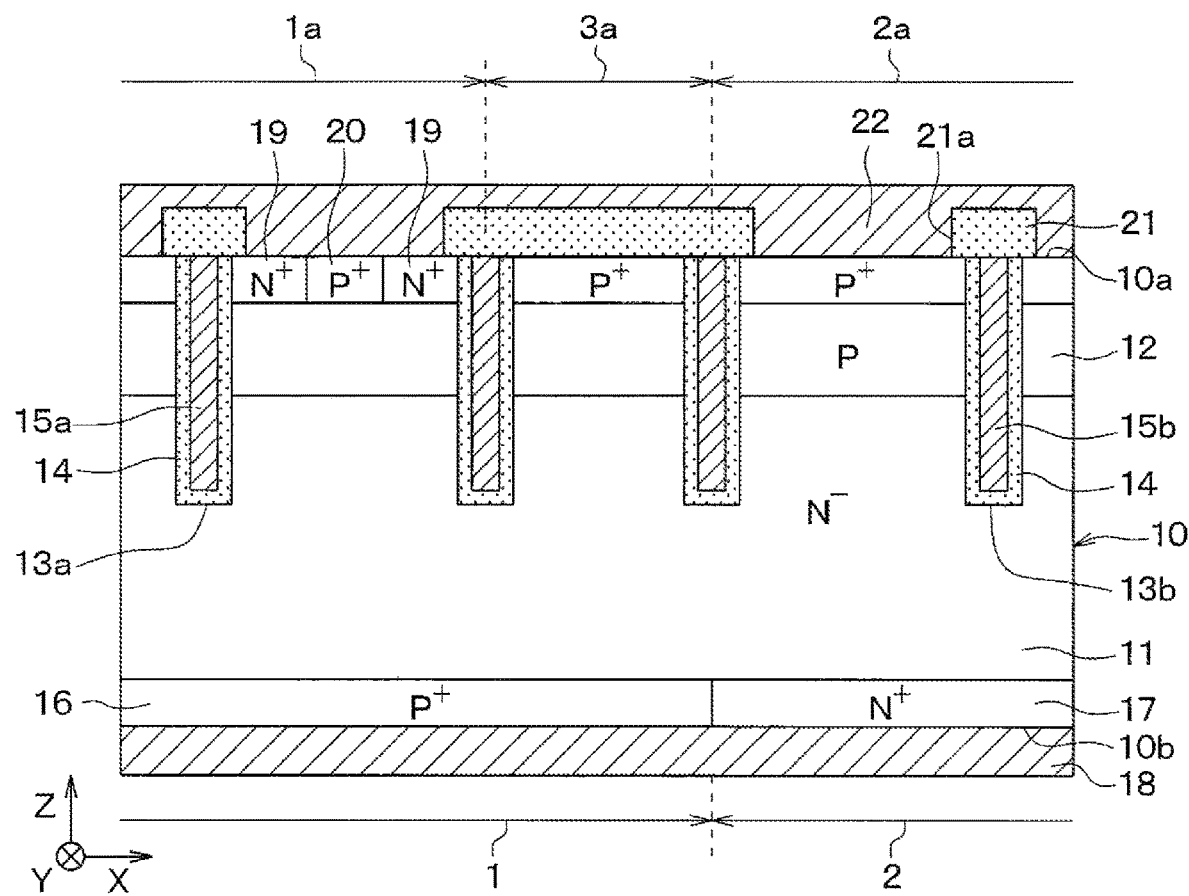
FIG. 1 is a cross-sectional view of a semiconductor device in a first embodiment.

In a conceivable semiconductor device, a base layer is formed on a surface layer portion of the semiconductor substrate configuring an $N^-$-type drift layer, and multiple trenches are provided so as to penetrate through the base layer of the semiconductor substrate. In each trench, a gate insulating film and a gate electrode are formed in a stated order. As a result, a trench gate structure is formed. An $N^+$-type emitter region is formed on a surface layer portion of the base layer so as to be in contact with the trenches. A $P^+$-type collector layer and an $N^+$-type cathode layer are formed on a back surface of the semiconductor substrate.

An upper electrode electrically connected to the base layer and the emitter region is formed on one surface as a front surface of the semiconductor substrate. A lower electrode electrically connected to the collector layer and the cathode layer is formed on the other surface as the back surface of the semiconductor substrate.

In such a semiconductor device, the region in which the collector layer is formed on the back surface side of the semiconductor substrate is referred to as an IGBT region, and the region in which the cathode layer is formed is referred to as an FWD region. In the FWD region, since the above configuration is employed, an FWD element having a PN junction is formed by the N-type cathode layer, the N-type drift layer, and the P-type base layer.

Further, in the above semiconductor device, the trench formed in the IGBT region has a grid shape in which a first trench extending in the one direction communicates with a second trench extending in a direction intersecting the one direction so as to connect the adjacent first trenches.

In such a semiconductor device, since the trenches are in a grid pattern, for example, the equipotential lines are formed so as to avoid the trenches as compared with the case where the trenches are in a stripe pattern, so that it is difficult to penetrate the equipotential lines into one side of the semiconductor substrate. Therefore, in the IGBT region, electric field concentration is less likely to occur, and the withstand voltage can be improved.

By the way, in the above-mentioned semiconductor device, it is also desired to further improve the withstand voltage in the FWD region. Therefore, it is conceivable that the trenches are in a grid pattern also in the FWD region. However, if the trenches in the FWD region are arranged in a grid pattern and the trenches in the IGBT region and the trenches in the FWD region are connected, the gate electrodes arranged in the IGBT region and the gate electrodes arranged in the FWD region may be electrically connected. In this case, since the gate electrode arranged in the FWD region has the same potential as the gate electrode arranged in the IGBT region, the characteristics of the FWD element may fluctuate.

Therefore, in order to improve the withstand voltage in the FWD region and suppress the fluctuation of the characteristics of the FWD element, for example, while forming the trench in the FWD region in a grid pattern, it is conceivable that the trench in the FWD region may not be communicated with the trench in the IGBT region. However, in this configuration, the trench density may be low in the region between the grid-like trenches formed in each region, and the withstand voltage of the region may be low.

In view of the above points, a semiconductor device is provided to be capable of improving withstand voltage.

According to one example of the present embodiments, the semiconductor device in which the IGBT region and the FWD region are formed on a common semiconductor substrate includes: a first conductive type drift layer; a second conductive type base layer formed on the drift layer; a plurality of trench gate structures having a gate insulation film formed on the wall surface of a trench penetrating the base layer and a gate electrode formed on the gate insulation film; a first conductive type emitter region as a surface portion of the base layer formed so as to be in contact with the trench in the IGBT region; the second conductive type collector layer formed on the opposite side of the base layer via the drift layer sandwiched therebetween; a first conductive type cathode layer formed on the opposite side of the base layer via the drift layer interposed therebetween and disposed adjacent to the collector layer; a first electrode electrically connected to the base layer and the emitter region; and a second electrode electrically connected to the collector layer and the cathode layer. The region on the collector layer is an IGBT region, the region on the cathode layer is an FWD region, and the trench includes: an IGBT trench in which the first gate electrode as a gate electrode formed in the IGBT region is arranged; and a FWD trench formed in the FWD region, in which the second gate electrode as a gate electrode controlled separately from the first gate electrode is arranged. The IGBT trench includes: a first IGBT trench extending in the first direction along one direction of the surface direction of the semiconductor substrate; and a second IGBT trench extending in the second direction perpendicular to the first direction on the surface direction of the semiconductor substrate, and the first and second IGBT trenches are communicated with each other to form a grid pattern. The FWD trench includes: a first FWD trench extending in the first direction and a second FWD trench extending in the second direction, and the first and second FWD trenches are communicated with each other to form a grid pattern.

Then, according to one example of the present embodiments, a portion between the center of the first IGBT trench located on the most FWD trench side and the center of the first FWD trench located on the most IGBT trench side is defined as a separate cell region, and a distance of the separate cell region in the second direction is defined as a separate cell pitch. A minimum distance between centers of adjacent first IGBT trenches is defined as a first IGBT trench pitch, and a minimum distance between centers of adjacent second IGBT trenches is defined as a second IGBT trench pitch. A minimum distance between centers of adjacent first FWD trenches is defined as a first FWD trench pitch, and a minimum distance between centers of adjacent second FWD trenches is defined as a second FWD trench pitch. The separate cell pitch is narrower than the first IGBT trench pitch, the second GBT trench pitch, the first FWD trench pitch, and the second FWD trench pitch.

According to this, in the separate cell region, the trench density can be increased as compared with the case where the separate cell pitch is equal to or larger than each trench pitch. Therefore, it becomes difficult for equipotential lines to penetrate into the base layer side even in the separate cell region, and it is possible to suppress the occurrence of electric field concentration also in the separate cell region. Therefore, since the withstand voltage in the separate cell region can be increased, the withstand voltage of the semiconductor device can be increased.

Further, according to another example of the present embodiments, a portion between the center of the first IGBT trench located on the most FWD trench side and the center of the first FWD trench located on the most IGBT trench side is defined as the separate cell region, and the distance of the separate cell region in the second direction is defined as the separate cell pitch. In the separate cell region, one dummy trench extending along the first direction is formed. A dummy insulation film and a dummy electrode are arranged in the dummy trench. The minimum distance between the centers of the adjacent first IGBT trenches is set as the first IGBT trench pitch, and the minimum distance between the centers of the adjacent second IGBT trenches is defined as the second IGBT trench pitch. The minimum distance between the centers of the adjacent first FWD trenches is defined as the first FWD trench pitch, and the minimum distance between the centers of the adjacent second FWD trenches is defined as the second FWD trench pitch. The distance between the center of the dummy trench and the center of the first IGBT trench adjacent to the dummy trench is defined as the first separate trench pitch. The distance between the center of the dummy trench and the center of the first FWD trench adjacent to the dummy trench is defined as the second separate trench pitch. The separate cell pitch is larger than at least one of the first IGBT trench pitch, the second IGBT trench pitch, the first FWD trench pitch and the second FWD trench pitch. The first separate trench pitch and the second separate trench pitch are narrower than the first IGBT trench pitch, the second IGBT trench pitch, the first FWD trench pitch and the second FWD trench pitch.

Further, according to another example of the present embodiments, a portion between the center of the first IGBT trench located on the most FWD trench side and the center of the first FWD trench located on the most IGBT trench side is defined as the separate cell region, and the distance of the separate cell region in the second direction is defined as the separate cell pitch. In the separate cell region, a plurality of dummy trenches extending along the first direction are formed. A dummy insulation film and a dummy electrode are arranged in each dummy trench. The minimum distance between the centers of the adjacent first IGBT trenches is set as the first IGBT trench pitch, and the minimum distance between the centers of the adjacent second IGBT trenches is defined as the second IGBT trench pitch. The minimum distance between the centers of the adjacent first FWD trenches is defined as the first FWD trench pitch, and the minimum distance between the centers of the adjacent second FWD trenches is defined as the second FWD trench pitch. The distance between the center of the dummy trench and the center of the first IGBT trench adjacent to the dummy trench is defined as the first separate trench pitch. The distance between the center of the dummy trench and the center of the first FWD trench adjacent to the dummy trench is defined as the second separate trench pitch. The maximum distance between the centers of the adjacent dummy trenches is defined as the third separate trench pitch. The separate cell pitch is larger than at least one of the first IGBT trench pitch, the second IGBT trench pitch, the first FWD trench pitch and the second FWD trench pitch. The first separate trench pitch and the second separate trench pitch and the third separate trench pitch are narrower than the first IGBT trench pitch, the second IGBT trench pitch, the first FWD trench pitch and the second FWD trench pitch.

From these viewpoints, each separate pitch is narrower than each trench pitch. Therefore, in the separate cell region, the trench density can be increased even if the separate cell pitch is equal to or higher than each trench pitch. Therefore, it becomes difficult for equipotential lines to penetrate into the base layer side even in the separate cell region, and it is possible to suppress the occurrence of electric field concentration also in the separate cell region. Therefore, since the withstand voltage in the separate cell region can be increased, the withstand voltage of the semiconductor device can be increased.

Further, according to another example of the present embodiments, a portion between the center of the first IGBT trench located on the most FWD trench side and the center of the first FWD trench located on the most IGBT trench side is defined as the separate cell region, and a portion of the IGBT region different from the separate cell region is defined as the IGBT cell region, and a portion of the FWD region different from the separate cell region is defined as the FWD cell region. The base layer in the separate cell region has an impurity amount per unit volume higher than the base layer in the IGBT cell region and the FWD cell region.

According to this, in the separate cell region, the depletion layer between the base layer and the drift layer extends toward the collector layer and the cathode layer side more than the IGBT cell region and the FWD cell region. Therefore, in the separate cell region, it becomes difficult for equipotential lines to enter the base layer side, and it is possible to suppress the occurrence of electric field concentration in the separate cell region. Therefore, since the withstand voltage in the separate cell region can be increased, the withstand voltage of the semiconductor device can be increased.

Further, according to another example of the present embodiments, a portion between the center of the first IGBT trench located on the most FWD trench side and the center of the first FWD trench located on the most IGBT trench side is defined as the separate cell region. In the separate cell region, a communication trench for connecting the first IGBT trench located on the most FWD trench side and the first FWD trench located on the most IGBT trench side is formed. In the communication trench, an insulation film that insulates the first gate electrode and the second gate electrode is arranged.

According to this, in the separate cell region, the trench density can be increased since the communication trench is formed. Therefore, it becomes difficult for equipotential lines to penetrate into the base layer side even in the separate cell region, and it is possible to suppress the occurrence of electric field concentration also in the separate cell region. Therefore, since the withstand voltage in the separate cell region can be increased, the withstand voltage of the semiconductor device can be increased.

The reference numerals in parentheses attached to the components and the like indicate an example of correspondence between the components and the like and specific components and the like in an embodiment to be described below.

Embodiments of the present disclosure will be described below with reference to the drawings. In the following embodiments, the same reference numerals are assigned to parts that are the same or equivalent to each other to describe the same.

First Embodiment

The following describes a first embodiment. A semiconductor device according to the present embodiment is preferably used as a power switching element used in power supply circuits such as inverters and DC/DC converters, for example.

As shown in FIG. 1, in the semiconductor device, the IGBT region 1 having an IGBT element and the FWD region 2 having an FWD element are formed on a common semiconductor substrate 10. That is, the semiconductor device of this embodiment is a RC (abbreviation of Reverse Conducting)—IGBT.

Specifically, the semiconductor device has a semiconductor substrate 10 that constitutes an $N^-$ type drift layer 11. In the present embodiment, the semiconductor substrate 10 includes a silicon substrate. A P type base layer 12 is formed on the drift layer 11. In other words, the top of the drift layer 11 is one surface 10a side of the semiconductor substrate 10.

Multiple trenches 13a, 13b are provided in the semiconductor substrate 10 so as to penetrate through the base layer 12 and reach the drift layer 11. In each trench 13a and 13b, a gate insulation film 14 formed so as to cover the wall surfaces of each trench 13a and 13b, and first and second gate electrodes 15a, 15b made of polysilicon or the like and ed on the gate insulation film 14 are embedded. As a result, a trench gate structure is formed.

Further, a $P^+$ type collector layer 16 and an $N^+$ type cathode layer 17 are formed on the opposite side of the base layer 12 via the drift layer 11 sandwiched therebetween. In the present embodiment, the IGBT region 3 and the FWD region 4 are distinguished from each other depending on whether a layer formed on the other surface 10b of the semiconductor substrate 10 is the collector layer 16 or the cathode layer 17. In other words, in the present embodiment, the portion on the collector layer 16 is the IGBT region 1, and the portion on the cathode layer 17 is the FWD region 2.

On the side opposite to the drift layer 11 across the collector layer 16 and the cathode layer 17 (that is, on the other surface 10b of the semiconductor substrate 10), a lower electrode 18 is formed to be electrically connected to the collector layer 16 and the cathode layer 17. In other words, the lower electrode 18 functioning as a collector electrode in the IGBT region 1 and a cathode electrode in the FWD region 2 is formed. In the present embodiment, the lower electrode 18 corresponds to a second electrode.

Figure 2:
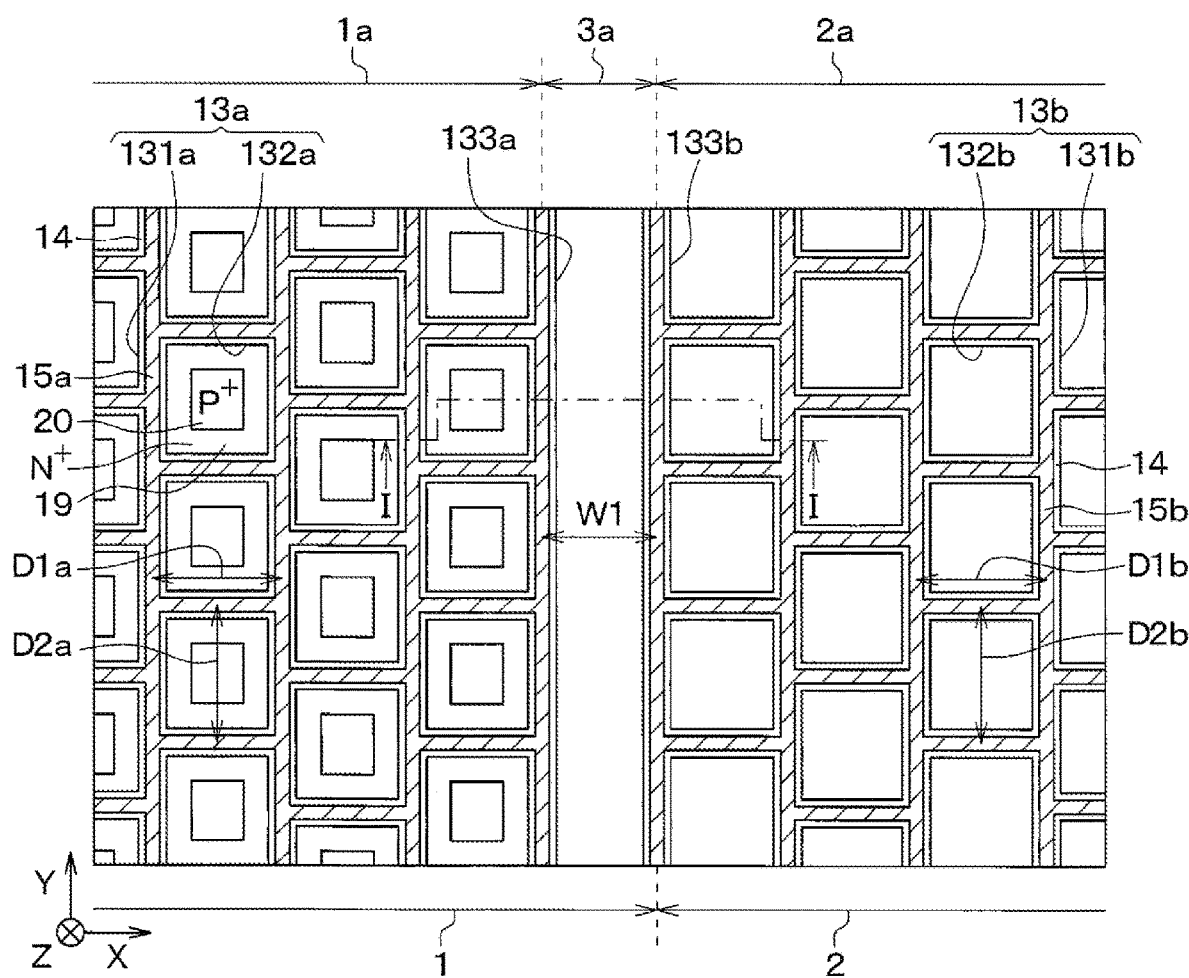
FIG. 2 is a plan view of the semiconductor device shown in FIG. 1.

Here, the shapes of the trenches 13a and 13b (that is, the shape of the trench gate structure) in the present embodiment will be described with reference to FIGS. 1 and 2. In the following, one direction in the plane direction of the semiconductor substrate 10 is defined as the X-axis direction, and one direction in the plane direction of the semiconductor substrate 10 and orthogonal to the X-axis direction is defined as the Y-axis direction. The direction orthogonal to the Y-axis direction and the X-axis direction is defined as the Z-axis direction. In FIG. 1, the left-right direction of the drawing surface is the X-axis direction, the vertical direction of the drawing surface is the Y-axis direction, and the up-down direction of the drawing surface is the Z-axis direction. In FIG. 2, the left-right direction of the drawing surface is the X-axis direction, the up-down direction of the drawing surface is the Y-axis direction, and the vertical direction of the drawing surface is the Z-axis direction. In the present embodiment, the Y-axis direction corresponds to the first direction, and the X-axis direction corresponds to the second direction. Further, also in each drawing described later, the X-axis direction, the Y-axis direction, and the Z-axis direction are shown as appropriate. In FIG. 2, the interlayer insulation film 21 and the upper electrode 22 described later are not shown, and although it is not a cross-sectional view, the first and second gate electrodes 15a and 15b are hatched for easy understanding. Further, also in each drawing corresponding to FIG. 2 described later, the interlayer insulation film 21 and the upper electrode 22 are not shown, and the first and second gate electrodes 15a and 15b are hatched.

In the semiconductor substrate 10, an IGBT trench 13a is formed in the IGBT region 1, an FWD trench 13b is formed in the FWD region 2, and the trenches 13a and 13b have a depth in the Z-axis direction as the depth direction.

The IGBT trench 13a is configured by communicating the first IGBT trench 131a extending along the Y-axis direction and the second IGBT trench 132a extending along the X-axis direction. The trench 13a has a grid pattern. In this embodiment, a plurality of three or more first IGBT trenches 131a are formed along the X-axis direction, and the intervals between the adjacent first IGBT trenches 131a are equal to each other. Further, a plurality of three or more second IGBT trenches 132a are formed along the Y-axis direction, and the intervals between adjacent second IGBT trenches 132a are equal to each other.

The FWD trench 13b is configured by communicating a first FWD trench 131b extending along the Y-axis direction and a second FWD trench 132b extending along the X-axis direction. The trench 13b has a grid pattern.

In this embodiment, a plurality of three or more first FWD trenches 131b are formed along the X-axis direction. The distance between the adjacent first FWD trenches 131b is equal to each other, and the distance between the adjacent first IGBT trenches 131a is also equal to each other. Further, a plurality of three or more second FWD trenches 132b are formed along the Y-axis direction. The distance between the adjacent second FWD trenches 132b is equal to each other, and the distance between the adjacent second IGBT trenches 132a is also equal to each other.

Further, in the present embodiment, two second IGBT trenches 132a, which project to the opposite side of the first IGBT trench 131a, are arranged so as to be displaced from each other along the Y-axis direction. That is, two second IGBT trenches 132a protruding to the opposite side of the one first IGBT trench 131a have an asymmetrical arrangement. Similarly, two second FWD trenches 132b protruding to the opposite side of the one first FWD trench 131b are arranged so as to be shifted from each other along the Y-axis direction. That is, two second FWD trenches 132b protruding to the opposite side of the one first FWD trench 131b have an asymmetrical arrangement.

In the present embodiment, the IGBT trench 13a and the FWD trench 13b are formed in this way. A trench extending along the X-axis direction is not formed between the IGBT trench 13a and the FWD trench 13b. That is, in the present embodiment, the IGBT trench 13a and the FWD trench 13b are not communicated with each other and are separated from each other. Therefore, the first gate electrode 15a embedded in the IGBT trench 13a and the second gate electrode 15b embedded in the FWD trench 13b are in a separated state and are electrically insulated.

Then, the first gate electrode 15a embedded in the IGBT trench 13a is connected to a gate drive circuit to which a predetermined gate voltage is applied via a gate wiring (not shown). On the other hand, the second gate electrode 15b embedded in the FWD trench 13b is connected to, for example, the upper electrode 22 described later and maintained at the potential of the upper electrode 22.

Regarding the IGBT trench 13a and the FWD trench 13b, more specifically, the trench in which the first gate electrode 15a is arranged is referred to as the IGBT trench 13a, and the trench in which the second gate electrode 15b is arranged is referred to as the FWD trench 13b. That is, in the present embodiment, as shown in FIG. 1, a trench is also formed on the boundary between the collector layer 16 and the cathode layer 17, but the second gate electrode 15b is formed in this trench as shown in FIG. 2. Therefore, this trench provides the FWD trench 13b.

In the following, one of the IGBT trenches 13a, which is disposed on the most FWD trench 13b side is also referred to as an edge IGBT trench 133a. Further, one of the FWD trenches 13b, which is disposed on the most IGBT trench 13a side is also referred to as an edge FWD trench 133b. In the present embodiment, the edge FWD trench 133b is configured so that the center thereof in the X-axis direction substantially coincides with the boundary between the collector layer 16 and the cathode layer 17.

In the following, the region between the center of the edge IGBT trench 133a and the center of the edge FWD trench 133b will also be referred to as a separate cell region 3a. Further, the region of the IGBT region 1 different from the separate cell region 3a is also referred to as an IGBT cell region 1a, and the region of the FWD region 2 different from the separate cell region 3a is also referred to as an FWD cell region 2a.

The center of the edge IGBT trench 133a is the center in the X-axis direction of the edge IGBT trench 133a, and the center of the edge FWD trench 133b is the center in the X-axis direction of the edge FWD trench 133b. Then, in the present embodiment, the center of the edge FWD trench 133b is configured to substantially coincide with the boundary between the collector layer 16 and the cathode layer 17. Therefore, the separate cell region 3a is included in the IGBT region 1, and all the FWD region 2 is the FWD cell region 2a.

Further, the distance between the center of the edge IGBT trench 133a and the center of the edge FWD trench 133b is defined as the separate cell pitch W1. That is, the distance along the X-axis direction in the separate cell region 3a is defined as the separate cell pitch W1.

Further, the distance between the centers of the adjacent first IGBT trenches 131a along the X-axis direction is defined as the first IGBT trench pitch D1a. The distance between the centers of the adjacent second IGBT trenches 132a along the Y-axis direction is defined as the second IGBT trench pitch D2a. The center of the first IGBT trench 131a is the center in the X-axis direction of the first IGBT trench 131a, and the center of the second IGBT trench 132a is the center in the Y-axis direction in the second IGBT trench 132a.

Similarly, the distance between the centers of the adjacent first FWD trenches 131b along the X-axis direction is defined as the first FWD trench pitch D1b. The distance between the centers of the adjacent second FWD trenches 132b along the Y-axis direction is defined as the second FWD trench pitch D2b. The center of the first FWD trench 131b is the center in the X-axis direction of the first FWD trench 131b, and the center of the second FWD trench 132b is the center in the Y-axis direction in the second FWD trench 132b.

Further, in the present embodiment, as described above, the distance between the adjacent first IGBT trenches 131a and the distance between the adjacent first FWD trenches 131b are equal to each other. Therefore, the first IGBT trench pitch D1a and the first FWD trench pitch D1b are equal to each other. Further, the distance between the adjacent second IGBT trenches 132a and the distance between the adjacent second FWD trenches 132b are equal to each other. Therefore, the second IGBT trench pitch D2a and the second FWD trench pitch D2b are equal to each other.

In the present embodiment, the separate cell pitch W1 is narrower than the trench pitches D1a, D2a, D1b, and D2b. Therefore, in the separate cell region 3a of the present embodiment, the trench density is higher than, for example, a case where the separate cell pitch W1 is equal to or higher than the first IGBT trench pitch D1a and the first FWD trench pitch D1b.

The above is the configuration of the trenches 13a and 13b in the present embodiment.

Then, in each IGBT cell region 1a, an N+ type emitter region 19 having a higher impurity concentration than the drift layer 11 and a P+ type contact region 20 having a higher impurity concentration than the base layer 12 are separately formed in the surface portion of the base layer 12. Specifically, in the present embodiment, the emitter region 19 is formed along the IGBT trench 13a. That is, the emitter region 19 is formed in a frame shape when viewed from the normal direction with respect to the surface direction of the semiconductor substrate 10. The contact region 20 is formed so as to be adjacent to the emitter region 19 and surrounded by the emitter region 19, and is formed at a position spaced away from the IGBT trench 13a. In other words, the surface portion of the base layer 12 is disposed on one surface 10a side of the semiconductor substrate 10.

Further, in the FWD cell region 2a and the separate cell region 3a, a contact region 20 similar to the contact region 20 in the IGBT cell region 1a is formed in the surface portion of the base layer 12. In this embodiment, the emitter region 19 is not formed in the separate cell region 3a. That is, the emitter region 19 is not formed on the separate cell region 3a side of the edge IGBT trench 133a. That is, in the present embodiment, in the separate cell region 3a, an IGBT element does not operate. As a result, it is possible to prevent the second gate electrode 15b arranged in the edge FWD trench 133b from interfering with the gate during the IGBT operation and from fluctuating the characteristics of the FWD element.

On one surface 10a of the semiconductor substrate 10, an interlayer insulation film 21 made of BPSG (Borophosphosilicate Glass) or the like is formed. An upper electrode 22 as a first electrode is formed on the interlayer insulation film 21 so as to be electrically connected to the emitter regions 19 and the contact regions 20 (that is, the base layer 12) through contact holes 21a provided in the interlayer insulation film 21. In other words, the upper electrode 22 is formed on the interlayer insulation film 21 to function as an emitter electrode in the IGBT region 3 and an anode electrode in the FWD region 4.

In the separate cell region 3a, a contact hole 21a for exposing the contact region 20 is formed in the interlayer insulation film 21 in a cross section different from that in FIG. 1. More specifically, although not particularly shown, the semiconductor device of the present embodiment has an outer peripheral region arranged so as to surround the IGBT region 1 and the FWD region 2. Then, in the separate cell region 3a, a contact hole is formed in the interlayer insulation film 21 in the vicinity of the outer peripheral region, and the contact region 20 is electrically connected to the upper electrode 22 through the contact hole 21a.

Therefore, when the diode operation is performed as described later, since the contact hole 21a of the separate cell region 3a is formed in the vicinity of the outer peripheral region, it becomes difficult for the carrier to flow into the upper electrode 22 through the separate cell region 3a. It is difficult to function the separate cell region 3a as a diode. As a result, it is possible to prevent the first gate electrode 15a arranged in the edge IGBT trench 133a from interfering with the gate during the operation of the diode and to prevent the characteristics of the IGBT element from fluctuating.

With the configuration described above, in the FWD cell region 2a, the FWD element is formed by PN junction having the base layer 12 and the contact region 20 as anodes and the drift layer 11 and the cathode layer 17 as cathodes.

The above description is the configuration of the semiconductor device in this embodiment. In the present embodiment, the N-type, the $N^+$-type, and the $N^-$-type correspond to a first conductivity type, and the P-type and the $P^+$-type correspond to a second conductivity type. Further, in the present embodiment, as described above, the semiconductor substrate 10 has a collector layer 16, a cathode layer 17, a drift layer 11, a base layer 12, an emitter region 19, and a contact region 20.

Next, the operation of the semiconductor device will be briefly described.

First, in the semiconductor device, when a voltage higher than that of the upper electrode 22 is applied to the lower electrode 18, the PN junction formed between the base layer 12 and the drift layer 11 is brought into a reverse conduction state to form a depletion layer. When a low-level voltage (for example, 0 V) that is less than a threshold voltage Vth of the insulated gate structure is applied to the first gate electrode 15a, a current does not flow between the upper electrode 22 and the lower electrode 18.

In order to turn the IGBT element to the ON-state, a high-level voltage, which is equal to or higher than the threshold voltage Vth of the insulated gate structure, is applied to the first gate electrode 15a in a state where a voltage higher than that of the upper electrode 22 is applied to the lower electrode 18. As a result, an inversion layer is formed in the portion of the base layer 12 in contact with the IGBT trench 13a in which the first gate electrode 15a is arranged. Each IGBT element is turned to the ON-state by supplying electrons from the emitter region 19 to the drift layer 11 through the inversion layer, thereby supplying holes from the collector layer 16 to the drift layer 11, and decreasing the resistance value of the drift layer 11 by the conductivity modulation.

When the IGBT element 3a is turned to OFF-state and the FWD element 4a is turned to the ON-state (that is, the FWD element 4a is operated as a diode), the voltage to be applied to the upper electrode 22 and the lower electrode 18 is switched, and a voltage higher than that applied to the lower electrode 18 is applied to the upper electrode 22. Then, a low-level voltage (for example, 0 V) that is less than the threshold voltage Vth of the insulated gate structure is applied to the gate electrodes 15a. As a result, the inversion layer is not formed in the portion of the base layer 12 which is in contact with the first IGBT trench 131a, and holes are supplied from the base layer 12 and electrons are supplied from the cathode layer 17, whereby the FWD element performs a diode operation.

Thereafter, when the FWD element 4a is switched from the ON-state to the OFF-state, a reverse voltage is applied to the lower electrode 18 to apply a voltage higher than that of the upper electrode 22. In other words, when a current is cut off from a state in which a forward current flows in the FWD element, a reverse voltage is applied to the lower electrode 18 so as to apply a voltage higher than the voltage applied to the upper electrode 22. As a result, the FWD element is turned off after being in the recovery state.

At this time, in the semiconductor device, the equipotential lines are formed to curve so as to avoid the trenches 13a and 13b. In the present embodiment, the separate cell pitch W1 is narrower than the trench pitches D1a, D2a, D1b, and D2b. Therefore, the trench density in the separate cell region 3a is higher than that in the case where the separate cell pitch W1 is set to be equal to the trench pitches D1a, D2a, D1b, D2b or more. Therefore, it becomes difficult for equipotential lines to penetrate into the base layer side even in the separate cell region, and it is possible to suppress the occurrence of electric field concentration also in the separate cell region. Therefore, since the withstand voltage in the separate cell region 3a can be increased, the withstand voltage of the semiconductor device can be increased.

As described above, in the present embodiment, the separate cell pitch W1 is narrower than the trench pitches D1a, D2a, D1b, and D2b. Therefore, the trench density in the separate cell region 3a is higher than that in the case where the separate cell pitch W1 is set to be equal to the trench pitches D1a, D2a, D1b, D2b or more. Therefore, it becomes difficult for equipotential lines to penetrate into the base layer side even in the separate cell region, and it is possible to suppress the occurrence of electric field concentration also in the separate cell region. Therefore, since the withstand voltage in the separate cell region 3a can be increased, the withstand voltage of the semiconductor device can be increased.

Second Embodiment

A second embodiment will be described. In this embodiment, a dummy trench is formed in the separate cell region 3a as compared with the first embodiment. The other configurations are the same as those of the first embodiment, and therefore a description of the same configurations will be omitted below.

Figure 3:
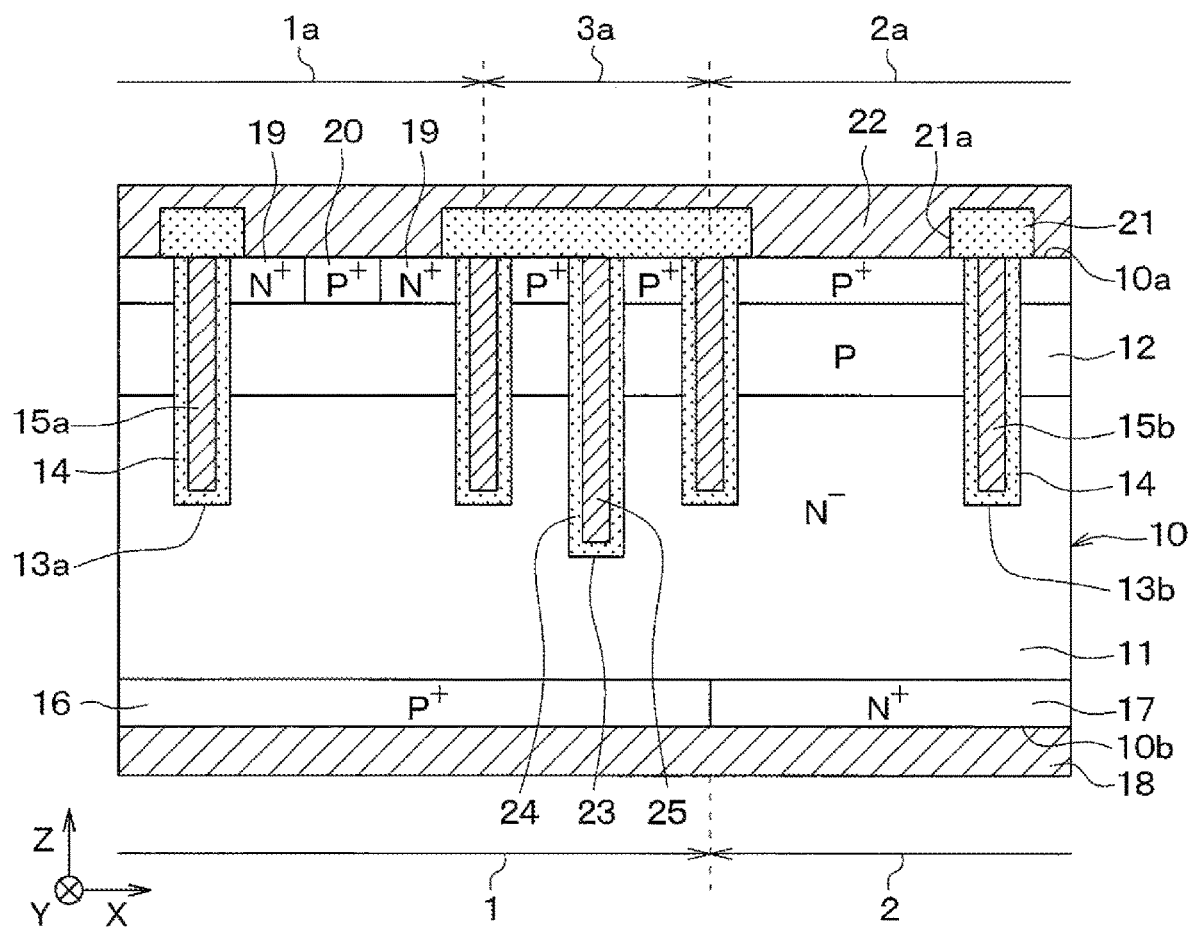
FIG. 3 is a cross-sectional view of a semiconductor device in a second embodiment.
Figure 4:
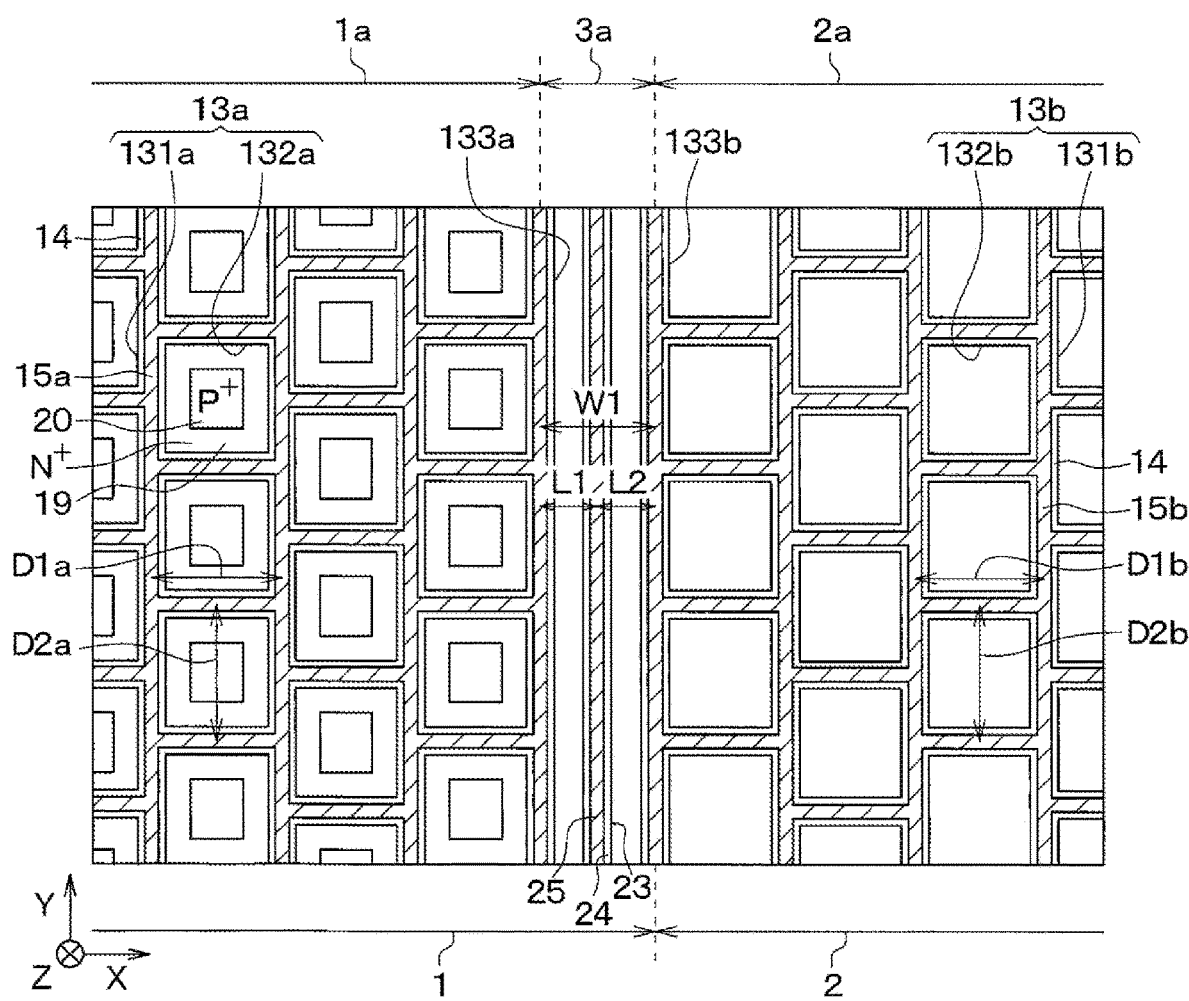
FIG. 4 is a plan view of the semiconductor device shown in FIG. 3.

In the present embodiment, as shown in FIGS. 3 and 4, one dummy trench 23 extending along the Y-axis direction and separated from the IGBT trench 13a and the FWD trench 13b is formed in the separation cell region 3a. In the present embodiment, the dummy trench 23 is formed deeper than the IGBT trench 13a and the FWD trench 13b.

The dummy trench 23 is embedded by a dummy insulation film 24 formed so as to cover the wall surface of the dummy trench 23 and a dummy electrode 25 formed of polysilicon or the like on the dummy insulation film 24. The dummy electrode 25 of the present embodiment is electrically connected to the upper electrode 22 in a cross section different from that of FIG. 1.

Here, in the present embodiment, the distance between the center of the dummy trench 23 and the center of the edge IGBT trench 133a is set as the first separate trench pitch L1. Further, the distance between the center of the dummy trench 23 and the center of the edge FWD trench 133b is set as the second separate trench pitch L2. The center of the dummy trench 23 is the center of the dummy trench 23 in the X-axis direction. Further, the separate cell pitch W1 is the sum of the first separate trench pitch L1 and the second separate trench pitch L2.

In the present embodiment, the first separate trench pitch L1 and the second separate trench pitch L2 are narrower than the trench pitches D1a, D2a, D1b, and D2b, and the separate cell pitch W1 is narrower than the trench pitches D1a, D2a, D1b, and D2b. In this embodiment, the first separate trench pitch L1 and the second separate trench pitch L2 are equal to each other.

As described above, in the present embodiment, the dummy trench 23 is formed in the separate cell region 3a. Therefore, in the separate cell region 3a, the trench density can be further increased, and the withstand voltage can be further improved.

Further, the dummy trench 23 is formed deeper than the IGBT trench 13a and the FWD trench 13b. Therefore, as compared with the case where the dummy trench 23 has the same depth as the IGBT trench 13a and the FWD trench 13b, the equipotential lines are more difficult to enter the base layer 12 side in the separate cell region 3a. Therefore, the withstand voltage of the separate cell region 3a can be further improved.

Modification of Second Embodiment

Figure 5:
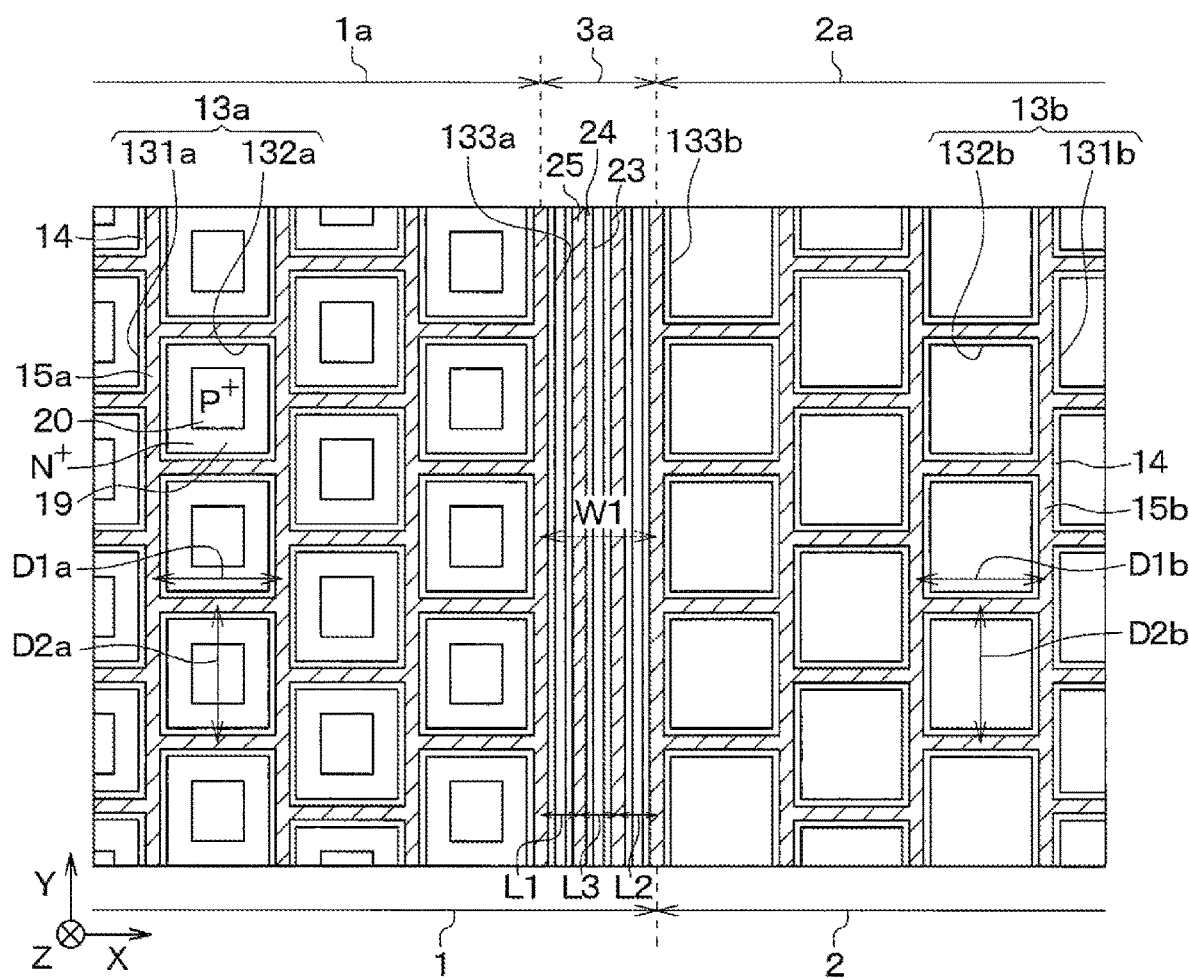
FIG. 5 is a plan view of a semiconductor device according to a modification of the second embodiment.

The modification of the second embodiment will be described below. In the second embodiment, as shown in FIG. 5, a plurality of dummy trenches 23 may be formed in the separate cell region 3a so as to be arranged along the X-axis direction. In this case, the distance between the center of the edge IGBT trench 133a and the center of the dummy trench 23 adjacent to the edge IGBT trench 133a is set as the first separate trench pitch L1. Further, the distance between the center of the edge FWD trench 133b and the center of the dummy trench 23 adjacent to the edge FWD trench 133b is defined as the second separate trench pitch L2. Then, the distance between the centers of the adjacent dummy trenches 23 is set as the third separate trench pitch L3. In this case, the first to third separate trench pitches L1 to L3 are narrower than the trench pitches D1a, D2a, D1b, and D2b, respectively.

Further, in such a modification, a plurality of dummy trenches 23 may be formed. In this case, the maximum distance between the centers of the adjacent dummy trenches 23 may be set to the third separate trench pitch L3.

Figure 6:
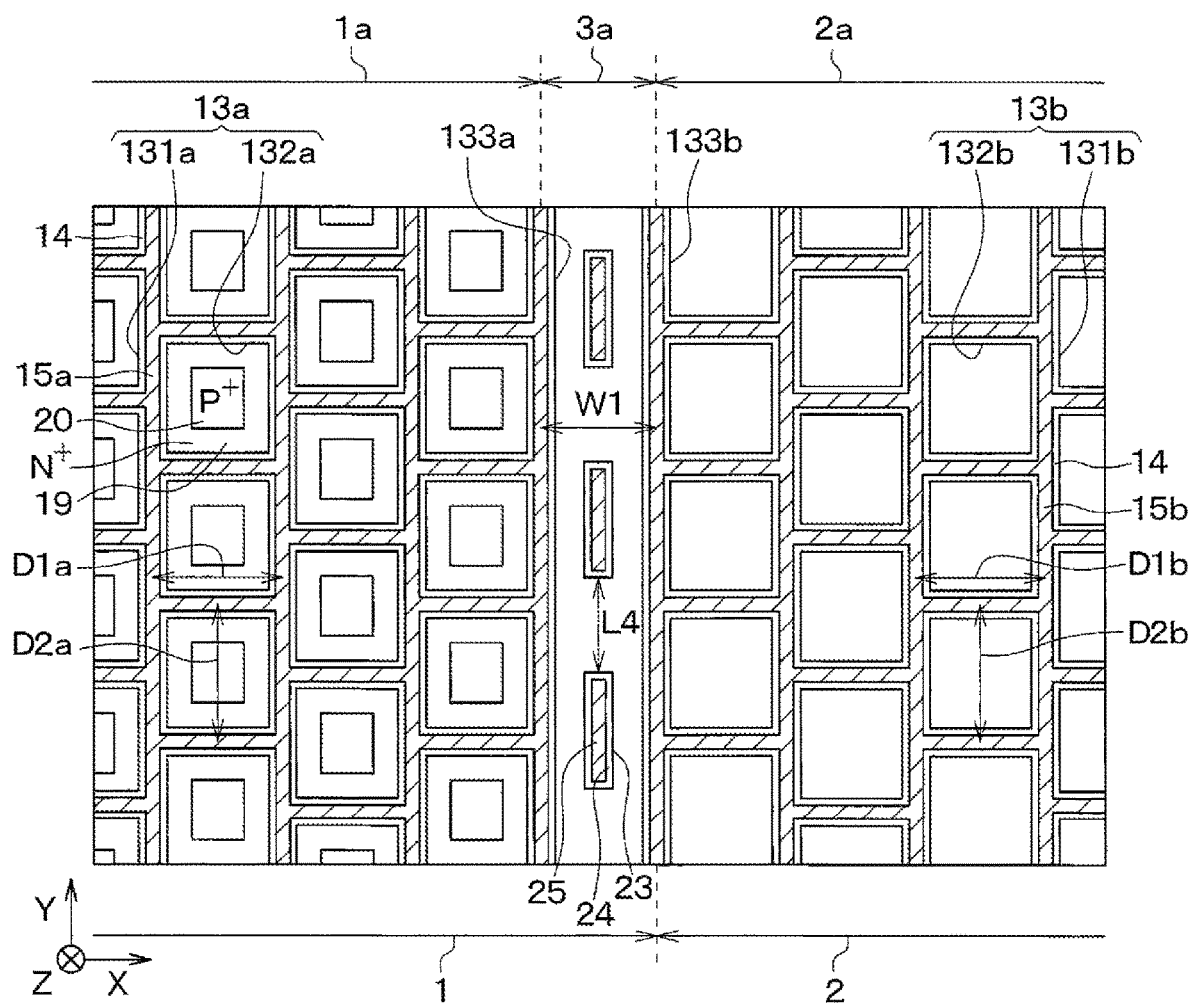
FIG. 6 is a plan view of a semiconductor device according to a modification of the second embodiment.

Further, in the second embodiment, as shown in FIG. 6, the dummy trench 23 may be separated into a plurality of pieces along the Y-axis direction. In the case of such a configuration, the distance between the dummy trenches 23 adjacent to each other along the Y-axis direction is defined as the fourth separate trench pitch L4. The dummy trench 23 also has a configuration such that the fourth separate trench pitch L4 is narrower than the trench pitches D1a, D2a, D1b, and D2b. As a result, the trench density of the separate cell region 3a can be improved, and the same effect as that of the second embodiment can be obtained.

Third Embodiment

A third embodiment will be described. The third embodiment is different from the second embodiment in that the relationship between the separate cell pitch W1 and the trench pitches D1a, D2a, D1b, and D2b is changed. The other configurations are the same as those of the first embodiment, and therefore a description of the same configurations will be omitted below.

Figure 7:
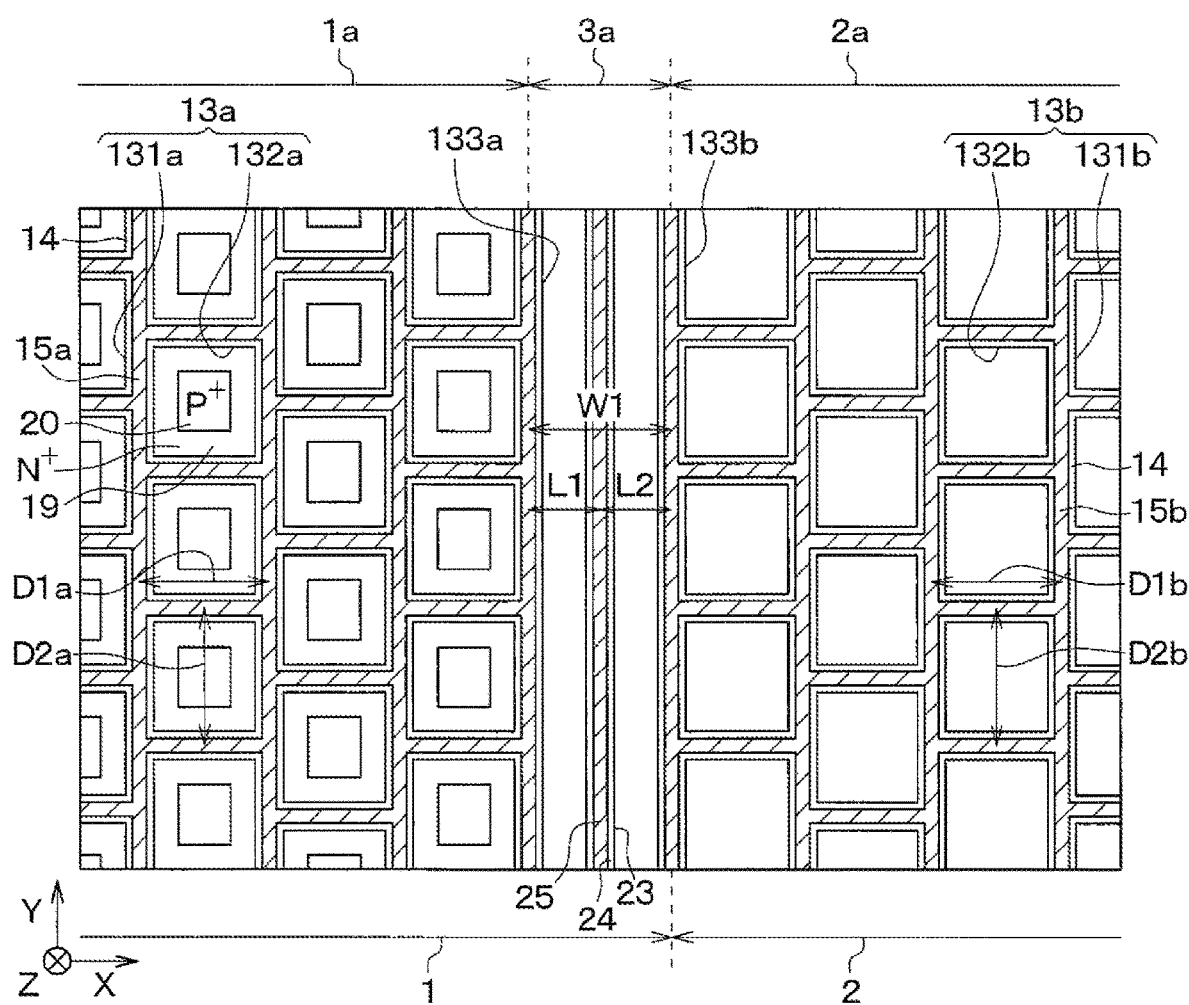
FIG. 7 is a plan view of a semiconductor device according to a third embodiment.

In this embodiment, as shown in FIG. 7, the separate cell pitch W1 is wider than the trench pitches D1a, D2a, D1b, and D2b, respectively. However, the first separate trench pitch L1 and the second separate trench pitch L2 are narrower than the trench pitches D1a, D2a, D1b, and D2b, respectively.

As described above, the separate cell pitch W1 may be wider than the trench pitches D1a, D2a, D1b, and D2b, respectively, as long as the first and second separate trench pitches L1 and L2 are narrower than the trench pitches D1a, D2a, D1b and D2b. Even in such a semiconductor device, since the trench density of the separate cell region 3a is improved, the same effect as that of the second embodiment can be obtained.

Although not shown in particular, the present embodiment can be appropriately combined with modified examples of the second embodiment. In this case, for example, when the configuration of FIG. 5 is adopted, the first to third separate trench pitches L1 to L3 may be narrower than the trench pitches D1a, D2a, D1b, and D2b, respectively.

Fourth Embodiment

A fourth embodiment will be described. The fourth embodiment is a modification of the first embodiment in which the configuration of the base layer 12 of the separate cell region 3a is changed. The remaining configuration is similar to that according to the first embodiment and will thus not be described repeatedly.

Figure 8:
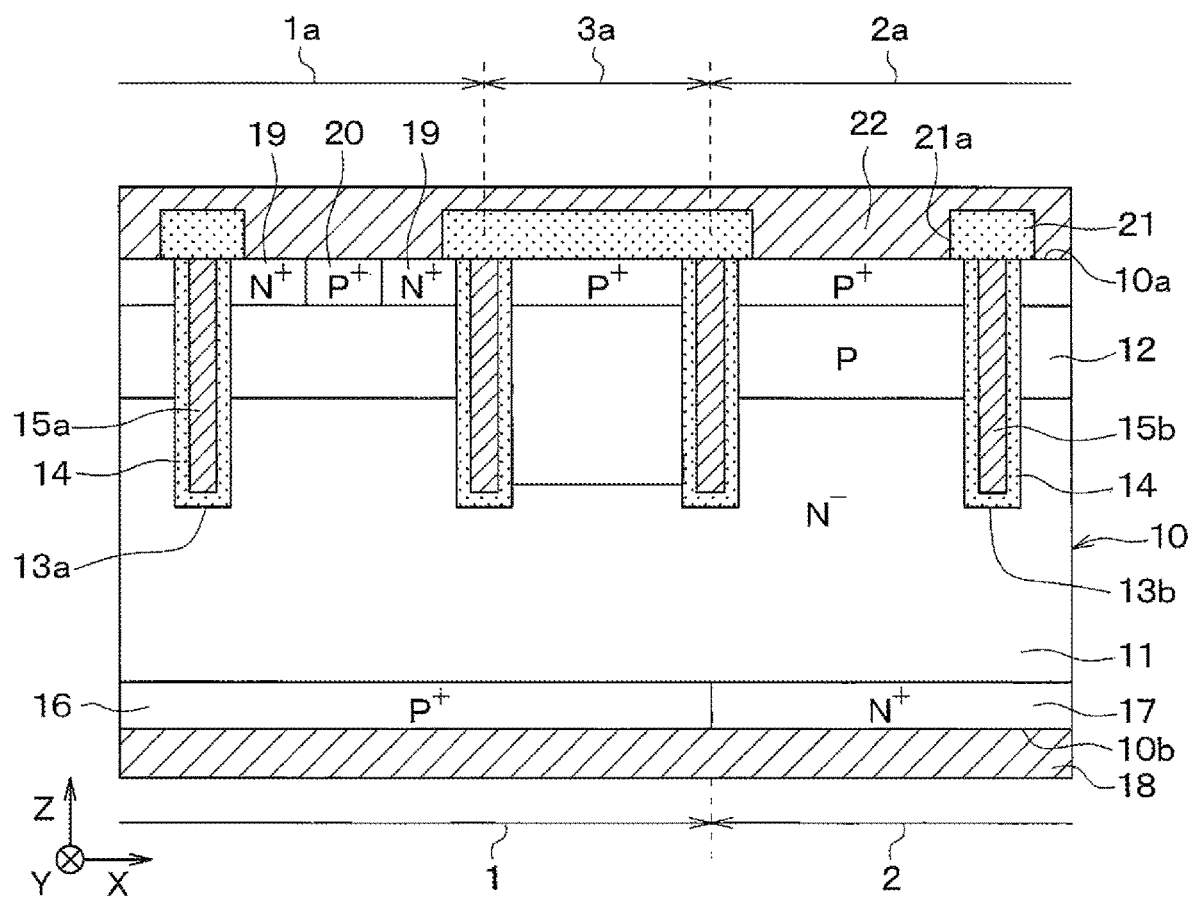
FIG. 8 is a cross-sectional view of a semiconductor device in a fourth embodiment.

In the present embodiment, as shown in FIG. 8, in the separate cell region 3a, the depth of the base layer 12 is formed deeper than that of the IGBT cell region is and the FWD cell region 2a. That is, the separate cell region 3a is configured so that the amount of impurities per unit volume in the base layer 12 is higher than that of the IGBT cell region 1a and the FWD cell region 2a.

The base layer 12 in such a semiconductor device is manufactured, for example, as follows. That is, the base layer 12 is formed by ion-implanting P-type impurities into the semiconductor substrate 10 and heat-treating it. In this case, in the portion constituting the separate cell region 3a, the base layer 12 is deeper than the IGBT cell region is and the FWD cell region 2a by increasing the acceleration voltage at the time of ion implantation or by performing the ion implantation a plurality of times.

As described above, in the present embodiment, in the separate cell region 3a, the base layer 12 is formed deeper than the IGBT cell region is and the FWD cell region 2a. Therefore, in the separate cell region 3a, the depletion layer between the base layer 12 and the drift layer 11 extends toward the other surface 10b of the semiconductor substrate 10 from the IGBT cell region is and the FWD cell region 2a. Therefore, it becomes further difficult for equipotential lines to penetrate into the base layer side even in the separate cell region, and it is possible to suppress the occurrence of electric field concentration also in the separate cell region.

Modification of Fourth Embodiment

The modification of the second embodiment will be described below. In the fourth embodiment, the base layer 12 in the separate cell region 3a may have a higher impurity concentration than the base layer 12 in the IGBT cell region 1a and the FWD cell region 2a. According to this, it becomes more difficult for equipotential lines to enter the base layer 12 side, and it is possible to suppress the occurrence of electric field concentration in the separate cell region 3a. In such a configuration, the base layer 12 in the separate cell region 3a may have the same depth as the base layer 12 in the IGBT cell region 1a and the FWD cell region 2a.

Further, in the fourth embodiment, the separate cell pitch W1 may be set to be equal to or larger than the trench pitches D1a, D2a, D1b, D2b. Even in such a semiconductor device, it is possible to suppress the occurrence of electric field concentration by changing the feature of the base layer 12 of the separate cell region 3a, so that the withstand voltage can be improved.

Fifth Embodiment

A fifth embodiment will be described. In this embodiment, a communication trench is formed in the separate cell region 3a as compared with the first embodiment. The remaining configuration is similar to that according to the first embodiment and will thus not be described repeatedly.

Figure 9:
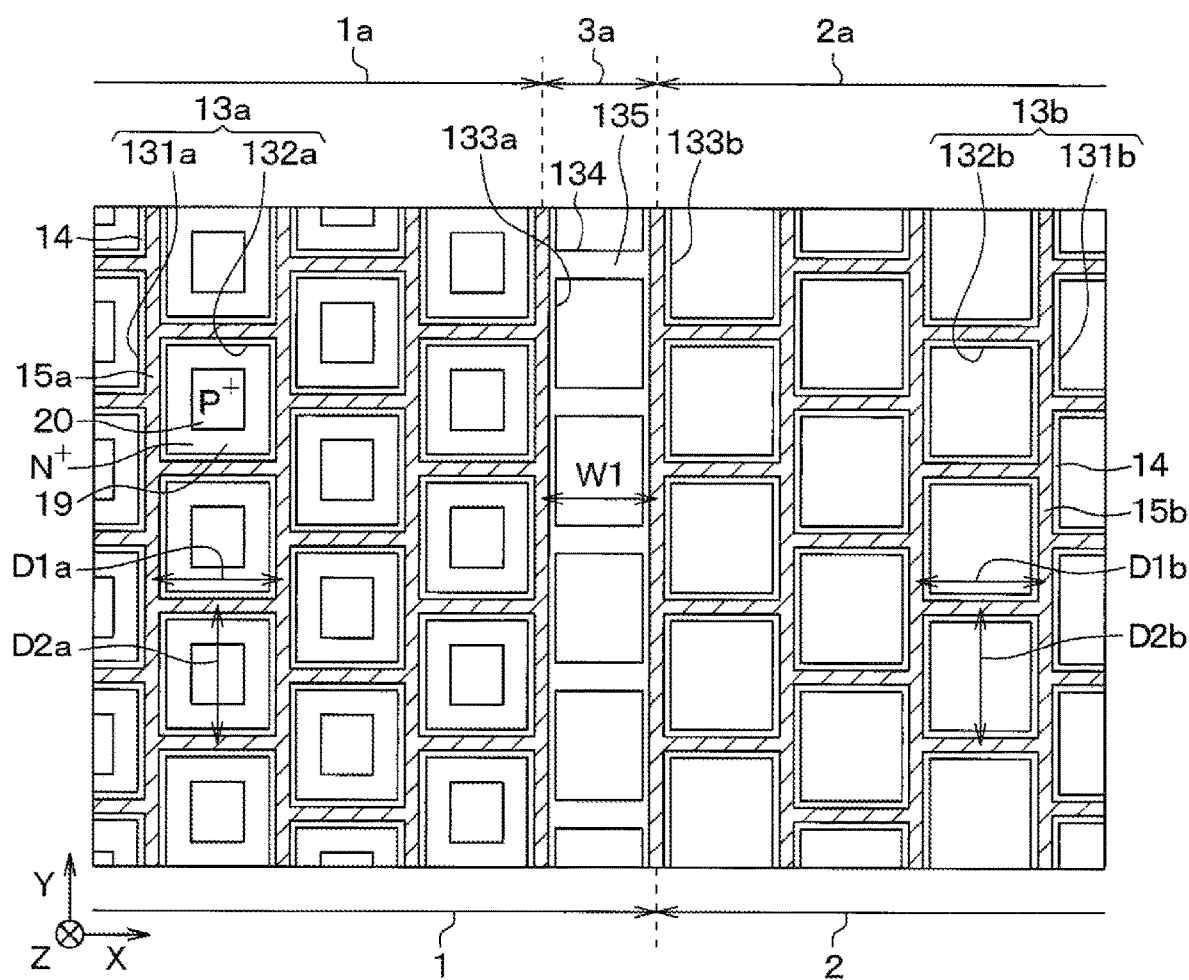
FIG. 9 is a plan view of a semiconductor device according to a fifth embodiment.

In the present embodiment, as shown in FIG. 9, a communication trench 134 connecting the edge IGBT trench 133a and the edge FWD trench 133b is formed in the separate cell region 3a. Specifically, the communication trench 134 is formed so as to extend along the X-axis direction, and a plurality of communication trenches 134 are formed. The edge IGBT trench 133a and the edge FWD trench 133b are communicated with each other via the communication trench 134. That is, in the present embodiment, the IGBT trench 13a and the FWD trench 13b are integrally formed.

An insulation film 135 that insulates the first gate electrode 15a and the second gate electrode 15b is arranged in the communication trench 134.

As described above, in the present embodiment, the communication trench 134 is formed in the separate cell region 3a. Therefore, the trench density of the separate cell region 3a can be further increased. Therefore, it is possible to further suppress the occurrence of electric field concentration in the separate cell region 3a.

Modification of Fifth Embodiment

The modification of the fifth embodiment will be described below. Further, in the fifth embodiment, the separate cell pitch W1 may be set to be equal to or larger than the trench pitches D1a, D2a, D1b, D2b. Even in such a semiconductor device, by forming the communication trench 134 in the separate cell region 3a, it is possible to suppress the occurrence of electric field concentration as compared with the case where the communication trench 134 is not formed, so that the withstand voltage can be improved.

Further, in the fifth embodiment, only one communication trench 134 may be formed. Even in such a semiconductor device, the trench density can be increased as compared with the case where the communication trench 134 is not formed.

Further, in the fifth embodiment, as long as the first gate electrode 15a and the second gate electrode 15b are insulated from each other, the first gate electrode 15a and the second gate electrode 15b may be partially extended to the inside of the communication trench 134.

Sixth Embodiment

A sixth embodiment will be described. In the sixth embodiment, a pillar region, a barrier region, and an electric field relaxation region are formed with respect to the first embodiment. The remaining configuration is similar to that according to the first embodiment and will thus not be described repeatedly.

Figure 10:
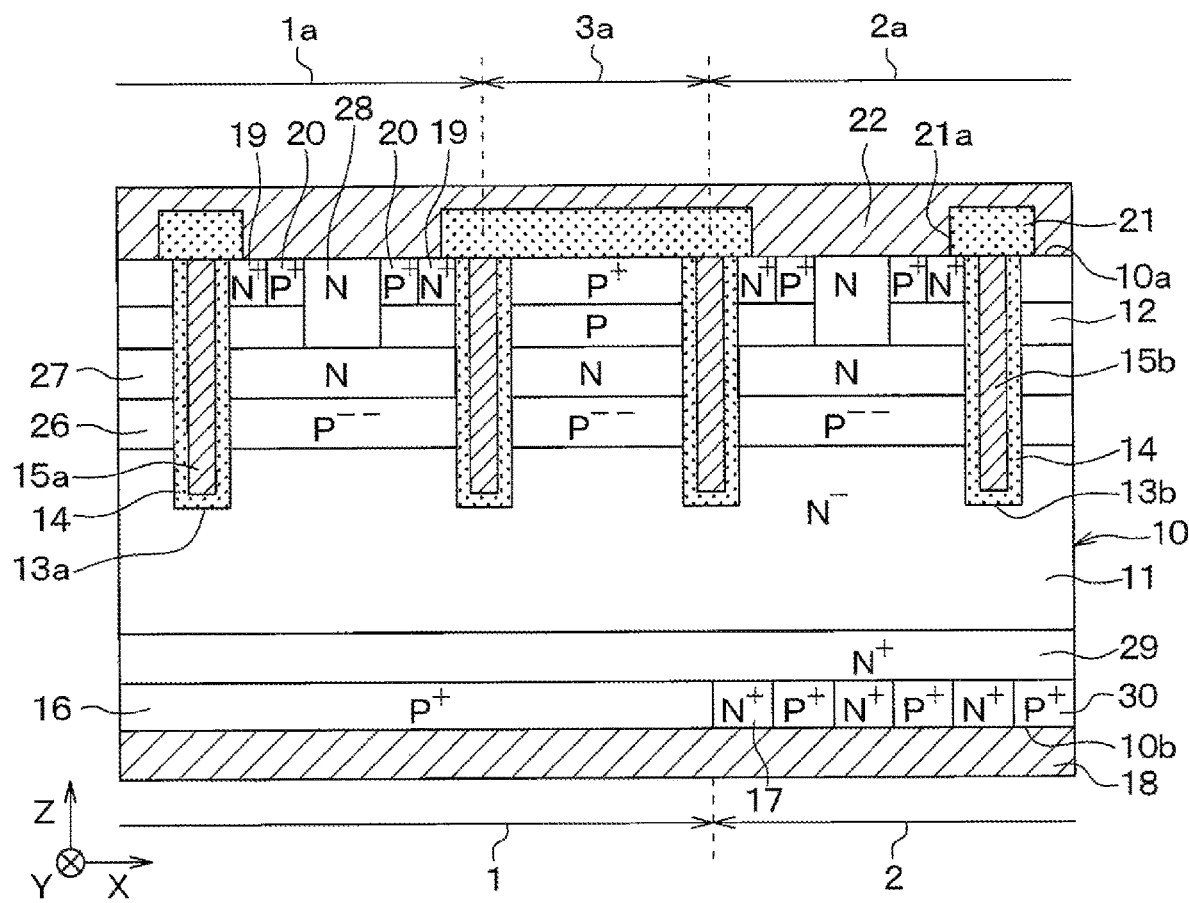
FIG. 10 is a cross-sectional view of a semiconductor device in a sixth embodiment.
Figure 11:
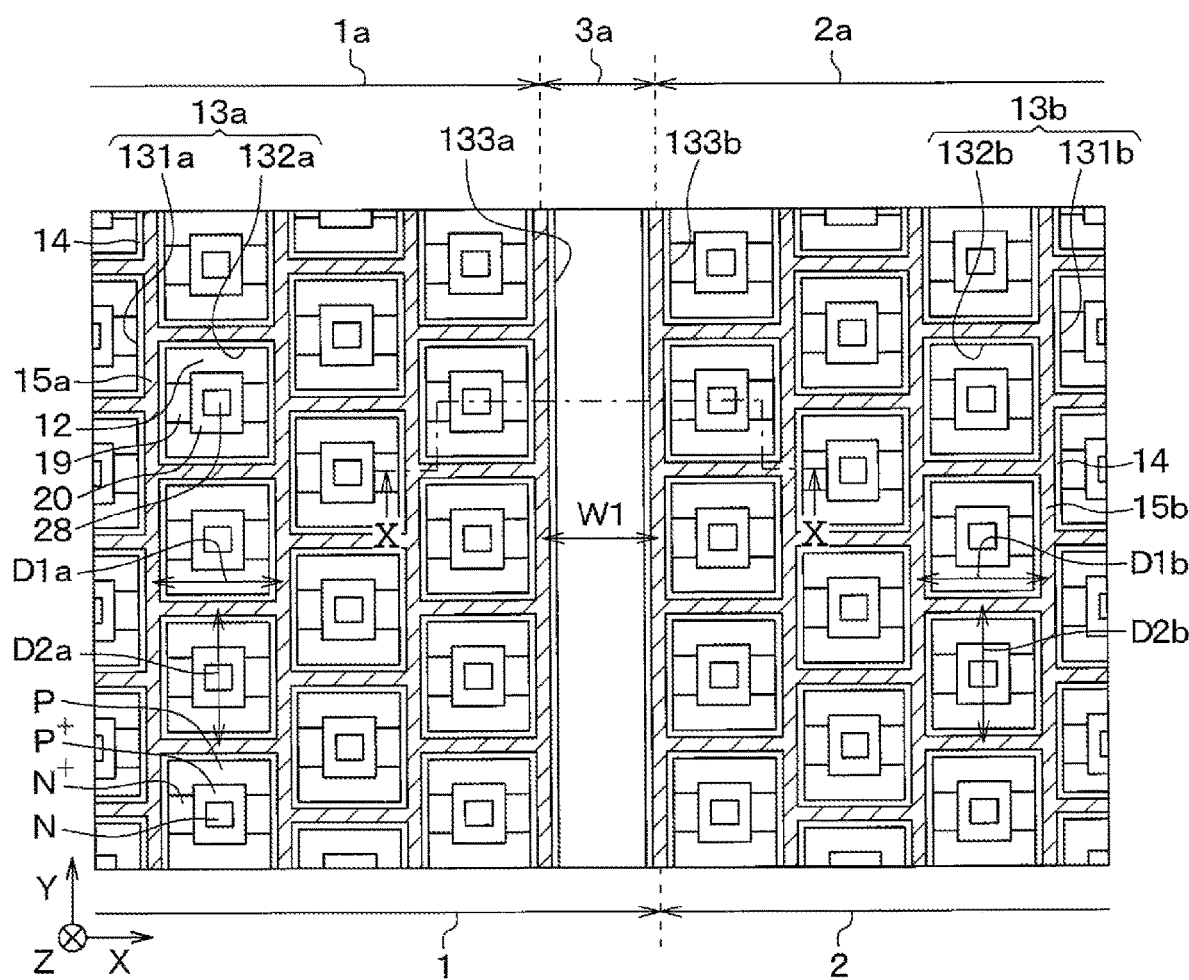
FIG. 11 is a plan view of a semiconductor device according to a sixth embodiment.

In the present embodiment, as shown in FIGS. 10 and 11, in the IGBT cell region 1a, the separate cell region 3a, and the FWD cell region 2a, a $P^-$ type electric field relaxation region 26 having an impurity concentration lower than the base layer 12 is formed between the drift layer 11 and the base layer 12. Then, in the IGBT cell region 1a, the FWD cell region 2a, and the separate cell region 3a, an N type barrier region 27 having a higher impurity concentration than the drift layer 11 is formed between the electric field relaxation region 26 and the base layer 12. The trenches 13a and 13b are formed so as to penetrate the base layer 12, the barrier region 27, and the electric field relaxation region 26 and reach the drift layer 11.

Further, in the present embodiment, the emitter region 19 is formed in the IGBT cell region 1a and the FWD cell region 2a. Specifically, in the IGBT cell region 1a, the emitter region 19 is formed along a portion located substantially at the center of each pair of first IGBT trenches 131a for providing one cell of the IGBT cell region 1a. Similarly, in the FWD cell region 2a, the emitter region 19 is formed along a portion located substantially at the center of the pair of first FWD trenches 131b providing one cell of the FWD cell region 2a.

Further, in the IGBT cell region 1a and the FWD cell region 2a, an N type pillar region 28 is formed in the surface portion of the base layer 12 so as to be surrounded by the contact region 20. The pillar region 28 is formed so as to reach the barrier region 27 and be connected to the barrier region 27. The pillar region 28 is Schottky connected to the upper electrode 22.

In the present embodiment, since the emitter region 19, the contact region 20, and the pillar region 28 are formed in the IGBT cell region 1a and the FWD cell region 2a as described above, the base layer 12 is formed on one surface 10a of the semiconductor substrate 10 so as to be exposed on the one surface 10a.

An N type field stop layer (referred to as an FS layer) 29 having an impurity concentration higher than that of the drift layer 11 is formed on a side of the drift layer 11 opposite to the base layer 12 (that is, on the side of the other surface 10b of the semiconductor substrate 10). The FS layer 29 is provided to improve withstand voltage and performance of steady loss by preventing spread of a depletion layer as well as to control implantation amount of holes implanted from the side of the other surface 10b of the semiconductor substrate 10.

Further, in the present embodiment, the cathode layer 17 is in a state in which a p+ type injection region 30 is partially formed. In the present embodiment, a plurality of injection regions 30 are formed and formed in a grid pattern, but only one region 30 may be formed, or the regions 30 may be formed to be a stripe pattern extending along the Y-axis direction, or the regions 30 may be irregularly formed. The injection region 30 has the same impurity concentration as the contact region 20.

In the present embodiment described above, the potential of the barrier region 27 is maintained at the potential of the upper electrode 22 via the pillar region 28. Therefore, in this semiconductor device, when the FWD element is turned on, the diode formed by the PN junction between the base layer 12 and the barrier region 27 is difficult to turn on, and the FWD element turns on when the potential of the upper electrode 22 is raised. Therefore, the diode operation can be stabilized.

Further, in the semiconductor device of the present embodiment, a P type electric field relaxation region 26 is formed between the barrier region 27 and the drift layer 11. Therefore, as compared with the case where the electric field relaxation region 26 is not formed, it is difficult for the equipotential lines to enter between the trenches 13a and 13b due to the PN junction formed between the electric field relaxation region 26 and the drift layer 11, so that the withstand voltage can be further improved.

Other Embodiments

Although the present disclosure has been described in accordance with embodiments, it is understood that the present disclosure is not limited to such embodiments or structures. The present disclosure encompasses various modifications and variations within the scope of equivalents. In addition, various combinations and forms, and further, other combinations and forms including only one element, or more or less than these elements are also within the sprit and the scope of the present disclosure.

For example, in each of the above-mentioned embodiments, the example is described in which the first conductive type is N type and the second conductive type is P type. Alternatively, the first conductive type may be P type and the second conductive type may be N type.

Further, in each of the above embodiments, in the separate cell region 3a, an emitter region 19 may be formed so as to be in contact with the IGBT trench 13a, and the emitter region 19 may also be connected to the upper electrode 22.

Further, in each of the above embodiments, in the separate cell region 3a, the contact hole 21a may be formed at a position spaced apart from the outer peripheral region. For example, in the first embodiment, in FIG. 1, a contact hole 21a that exposes the contact region 20 of the separate cell region 3a may be formed.

Further, in each of the above embodiments, the boundary between the collector layer 16 and the cathode layer 17 may be formed at another position. For example, the boundary between the collector layer 16 and the cathode layer 17 may be formed directly below the edge IGBT trench 133a, or formed at a center between the edge IGBT trench 133a and the edge FWD trench 133b. That is, the separate cell region 3a may be included only in the FWD region 2, or may be included in both the IGBT region 1 and the FWD region 2.

Further, in the first, second, fourth to sixth embodiments, for example, the intervals between adjacent first IGBT trenches 131a may be different, and the first IGBT trench pitch D1a may be different at each part. Similarly, the distance between the adjacent second IGBT trenches 132a, the distance between the adjacent first FWD trenches 131b, and the distance between the second FWD trenches 132b may be also different. In the case of such a configuration, the separate cell pitch W1 may be narrower than the minimum value of each trench pitch D1a, D2a, D1b, D2b.

Further, in the first to fifth embodiments, the emitter region 19 may be formed also in the FWD region 2. Then, in the sixth embodiment, the emitter region 19 may not be formed in the FWD region 2.

Further, in the second embodiment, the dummy electrode 25 may not be connected to the upper electrode 22 or the like and may be in a floating state.

Further, the above embodiments may be combined together as appropriate. For example, the fourth embodiment can be appropriately combined with the second and third embodiments. Further, the fifth embodiment can be appropriately combined with the second to fourth embodiments. Further, the sixth embodiment can be appropriately combined with the second to fifth embodiments. Further, a combination of the above embodiments may be further combined.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device in which an IGBT region and a FWD region are disposed in a common semiconductor substrate, the semiconductor device comprising:
   a drift layer having a first conductive type;
   a base layer having a second conductive type disposed on the drift layer;
   a plurality of trench gate structures having a gate insulation film arranged on a wall surface of a trench penetrating the base layer and a gate electrode arranged on the gate insulation film;
   an emitter region having the first conductive type arranged in a surface portion of the base layer and in contact with the trench in the IGBT region;
   a collector layer having the second conductive type arranged on a side opposite to the base layer side via the drift layer interposed therebetween;
   a cathode layer having the first conductive type arranged on the side opposite to the base layer via the drift layer interposed therebetween and adjacent to the collector layer;
   a first electrode electrically connected to the base layer and the emitter region; and
   a second electrode electrically connected to the collector layer and the cathode layer, wherein:
   a region on the collector layer is defined as the IGBT region, and a region on the cathode layer is defined as the FWD region;
   the trench includes an IGBT trench in which the gate electrode in the IGBT region is arranged as a first gate electrode, and a FWD trench in which the gate electrode in the FWD region is arranged as a second gate electrode that is controlled independently from the first gate electrode;
   the IGBT trench has a grid pattern in which a first IGBT trench extending in a first direction along one direction in a surface direction of the semiconductor substrate and a second IGBT trench extending in a second direction intersecting the first direction in the surface direction of the semiconductor substrate are communicated with each other;
   the FWD trench has a grid pattern in which a first FWD trench extending in the first direction and a second FWD trench extending in the second direction are communicated with each other;
   a portion between a center of the first IGBT trench located closest to the FWD trench and a center of the first FWD trench located closest to the IGBT trench is defined as a separate cell region;
   a length of the separate cell region in the second direction is defined as a separate cell pitch;
   a minimum distance between centers of adjacent first IGBT trenches is defined as a first IGBT trench pitch;
   a minimum distance between centers of adjacent second IGBT trenches is defined as a second IGBT trench pitch;
   a minimum distance between centers of adjacent first FWD trenches is defined as a first FWD trench pitch;
   a minimum distance between centers of adjacent second FWD trenches is defined as a second FWD trench pitch; and
   the separate cell pitch is narrower than the first IGBT trench pitch, the second IGBT trench pitch, the first FWD trench pitch, and the second FWD trench pitch, respectively.

2. The semiconductor device according to claim 1, further comprising:
   a dummy trench disposed in the separate cell region and extending along the first direction, wherein:
   in the dummy trench, a dummy insulation film and a dummy electrode are arranged.

3. The semiconductor device according to claim 1, wherein:
   a portion of the IGBT region different from the separate cell region is defined as an IGBT cell region;
   a portion of the FWD region different from the separate cell region is defined as a FWD cell region; and
   the base layer in the separate cell region has a higher impurity amount per unit volume than the base layer in the IGBT cell region and the FWD cell region.

4. The semiconductor device according to claim 3, wherein:
   the base layer in the separate cell region is deeper than the base layer in the IGBT cell region and the FWD cell region.

5. The semiconductor device according to claim 3, wherein:
   the base layer in the separate cell region has a higher impurity concentration than the base layer in the IGBT cell region and the FWD cell region.

6. The semiconductor device according to claim 1, further comprising:
   a communication trench disposed in the separate cell region and connecting the first IGBT trench located closest to the FWD trench and the first FWD trench located closest to the IGBT trench, wherein:
   in the communication trench, an insulation film that insulates the first gate electrode and the second gate electrode is arranged.

7. The semiconductor device according to claim 1, further comprising:
   an electric field relaxation region having the second conductive type and disposed between the drift layer and the base layer;
   a barrier region having the first conductive type and disposed between the electric field relaxation region and the base layer; and
   a pillar region having the first conductive type, disposed in a surface portion of the base layer and connecting to the first electrode and the barrier region.

8. A semiconductor device in which an IGBT region and a FWD region are disposed in a common semiconductor substrate, the semiconductor device comprising:
   a drift layer having a first conductive type;
   a base layer having a second conductive type disposed on the drift layer;
   a plurality of trench gate structures having a gate insulation film arranged on a wall surface of a trench penetrating the base layer and a gate electrode arranged on the gate insulation film;
   an emitter region having the first conductive type arranged in a surface portion of the base layer and in contact with the trench in the IGBT region;
   a collector layer having the second conductive type arranged on a side opposite to the base layer side via the drift layer interposed therebetween;

a cathode layer having the first conductive type arranged on the side opposite to the base layer via the drift layer interposed therebetween and adjacent to the collector layer;
a first electrode electrically connected to the base layer and the emitter region; and
a second electrode electrically connected to the collector layer and the cathode layer, wherein:
a region on the collector layer is defined as the IGBT region, and a region on the cathode layer is defined as the FWD region;
the trench includes an IGBT trench in which the gate electrode in the IGBT region is arranged as a first gate electrode, and a FWD trench in which the gate electrode in the FWD region is arranged as a second gate electrode that is controlled independently from the first gate electrode;
the IGBT trench has a grid pattern in which a first IGBT trench extending in a first direction along one direction in a surface direction of the semiconductor substrate and a second IGBT trench extending in a second direction intersecting the first direction in the surface direction of the semiconductor substrate are communicated with each other;
the FWD trench has a grid pattern in which a first FWD trench extending in the first direction and a second FWD trench extending in the second direction are communicated with each other;
a portion between a center of the first IGBT trench located closest to the FWD trench and a center of the first FWD trench located closest to the IGBT trench is defined as a separate cell region;
a length of the separate cell region in the second direction is defined as a separate cell pitch;
in the separate cell region, a dummy trench is disposed and extends along the first direction;
in the dummy trench, a dummy insulation film and a dummy electrode are arranged;
a minimum distance between centers of adjacent first IGBT trenches is defined as a first IGBT trench pitch;
a minimum distance between centers of adjacent second IGBT trenches is defined as a second IGBT trench pitch;
a minimum distance between centers of adjacent first FWD trenches is defined as a first FWD trench pitch;
a minimum distance between centers of adjacent second FWD trenches is defined as a second FWD trench pitch;
a distance between a center of the dummy trench and a center of the first IGBT trench adjacent to the dummy trench is defined as a first separate trench pitch;
a distance between the center of the dummy trench and a center of the first FWD trench adjacent to the dummy trench is defined as a second separate trench pitch;
the separate cell pitch is larger than at least one of the first IGBT trench pitch, the second IGBT trench pitch, the first FWD trench pitch, and the second FWD trench pitch; and
the first separate trench pitch and the second separate trench pitch are respectively narrower than the first IGBT trench pitch, the second IGBT trench pitch, the first FWD trench pitch, and the second FWD trench pitch.

9. A semiconductor device in which an IGBT region and a FWD region are disposed in a common semiconductor substrate, the semiconductor device comprising:
a drift layer having a first conductive type;
a base layer having a second conductive type disposed on the drift layer;
a plurality of trench gate structures having a gate insulation film arranged on a wall surface of a trench penetrating the base layer and a gate electrode arranged on the gate insulation film;
an emitter region having the first conductive type arranged in a surface portion of the base layer and in contact with the trench in the IGBT region;
a collector layer having the second conductive type arranged on a side opposite to the base layer side via the drift layer interposed therebetween;
a cathode layer having the first conductive type arranged on the side opposite to the base layer via the drift layer interposed therebetween and adjacent to the collector layer;
a first electrode electrically connected to the base layer and the emitter region; and
a second electrode electrically connected to the collector layer and the cathode layer, wherein:
a region on the collector layer is defined as the IGBT region, and a region on the cathode layer is defined as the FWD region;
the trench includes an IGBT trench in which the gate electrode in the IGBT region is arranged as a first gate electrode, and a FWD trench in which the gate electrode in the FWD region is arranged as a second gate electrode that is controlled independently from the first gate electrode;
the IGBT trench has a grid pattern in which a first IGBT trench extending in a first direction along one direction in a surface direction of the semiconductor substrate and a second IGBT trench extending in a second direction intersecting the first direction in the surface direction of the semiconductor substrate are communicated with each other;
the FWD trench has a grid pattern in which a first FWD trench extending in the first direction and a second FWD trench extending in the second direction are communicated with each other;
a portion between a center of the first IGBT trench located closest to the FWD trench and a center of the first FWD trench located closest to the IGBT trench is defined as a separate cell region;
a length of the separate cell region in the second direction is defined as a separate cell pitch;
in the separate cell region, a plurality of dummy trenches are disposed and extend along the first direction;
in the dummy trench, a dummy insulation film and a dummy electrode are arranged;
a minimum distance between centers of adjacent first IGBT trenches is defined as a first IGBT trench pitch;
a minimum distance between centers of adjacent second IGBT trenches is defined as a second IGBT trench pitch;
a minimum distance between centers of adjacent first FWD trenches is defined as a first FWD trench pitch;
a minimum distance between centers of adjacent second FWD trenches is defined as a second FWD trench pitch;
a distance between a center of the dummy trench and a center of the first IGBT trench adjacent to the dummy trench is defined as a first separate trench pitch;
a distance between the center of the dummy trench and a center of the first FWD trench adjacent to the dummy trench is defined as a second separate trench pitch;

a maximum distance between centers of adjacent dummy trenches is defined as a third separate trench pitch;

the separate cell pitch is larger than at least one of the first IGBT trench pitch, the second IGBT trench pitch, the first FWD trench pitch, and the second FWD trench pitch; and the first separate trench pitch, the second separate trench pitch and the third separate trench pitch are respectively narrower than the first IGBT trench pitch, the second IGBT trench pitch, the first FWD trench pitch, and the second FWD trench pitch.

10. A semiconductor device in which an IGBT region and a FWD region are disposed in a common semiconductor substrate, the semiconductor device comprising:

a drift layer having a first conductive type;

a base layer having a second conductive type disposed on the drift layer;

a plurality of trench gate structures having a gate insulation film arranged on a wall surface of a trench penetrating the base layer and a gate electrode arranged on the gate insulation film;

an emitter region having the first conductive type arranged in a surface portion of the base layer and in contact with the trench in the IGBT region;

a collector layer having the second conductive type arranged on a side opposite to the base layer side via the drift layer interposed therebetween;

a cathode layer having the first conductive type arranged on the side opposite to the base layer via the drift layer interposed therebetween and adjacent to the collector layer;

a first electrode electrically connected to the base layer and the emitter region; and a second electrode electrically connected to the collector layer and the cathode layer, wherein:

a region on the collector layer is defined as the IGBT region, and a region on the cathode layer is defined as the FWD region;

the trench includes an IGBT trench in which the gate electrode in the IGBT region is arranged as a first gate electrode, and a FWD trench in which the gate electrode in the FWD region is arranged as a second gate electrode that is controlled independently from the first gate electrode;

the IGBT trench has a grid pattern in which a first IGBT trench extending in a first direction along one direction in a surface direction of the semiconductor substrate and a second IGBT trench extending in a second direction intersecting the first direction in the surface direction of the semiconductor substrate are communicated with each other;

the FWD trench has a grid pattern in which a first FWD trench extending in the first direction and a second FWD trench extending in the second direction are communicated with each other;

a portion between a center of the first IGBT trench located closest to the FWD trench and a center of the first FWD trench located closest to the IGBT trench is defined as a separate cell region;

a portion of the IGBT region different from the separate cell region is defined as an IGBT cell region;

a portion of the FWD region different from the separate cell region is defined as a FWD cell region;

the base layer in the separate cell region has a higher impurity amount per unit volume than the base layer in the IGBT cell region and the FWD cell region;

the base layer in the separate cell region has a higher impurity concentration than the base layer in the IGBT cell region and the FWD cell region; and the base layer in the separate cell region has a depth equal to a depth of the base layer in the IGBT cell region and the FWD cell region.

11. A semiconductor device in which an IGBT region and a FWD region are disposed in a common semiconductor substrate, the semiconductor device comprising:

a drift layer having a first conductive type;

a base layer having a second conductive type disposed on the drift layer;

a plurality of trench gate structures having a gate insulation film arranged on a wall surface of a trench penetrating the base layer and a gate electrode arranged on the gate insulation film;

an emitter region having the first conductive type arranged in a surface portion of the base layer and in contact with the trench in the IGBT region;

a collector layer having the second conductive type arranged on a side opposite to the base layer side via the drift layer interposed therebetween;

a cathode layer having the first conductive type arranged on the side opposite to the base layer via the drift layer interposed therebetween and adjacent to the collector layer;

a first electrode electrically connected to the base layer and the emitter region; and a second electrode electrically connected to the collector layer and the cathode layer, wherein:

a region on the collector layer is defined as the IGBT region, and a region on the cathode layer is defined as the FWD region;

the trench includes an IGBT trench in which the gate electrode in the IGBT region is arranged as a first gate electrode, and a FWD trench in which the gate electrode in the FWD region is arranged as a second gate electrode that is controlled independently from the first gate electrode;

the IGBT trench has a grid pattern in which a first IGBT trench extending in a first direction along one direction in a surface direction of the semiconductor substrate and a second IGBT trench extending in a second direction intersecting the first direction in the surface direction of the semiconductor substrate are communicated with each other;

the FWD trench has a grid pattern in which a first FWD trench extending in the first direction and a second FWD trench extending in the second direction are communicated with each other;

a portion between a center of the first IGBT trench located closest to the FWD trench and a center of the first FWD trench located closest to the IGBT trench is defined as a separate cell region;

in the separate cell region, a communication trench is disposed therein and connects the first IGBT trench located closest to the FWD trench and the first FWD trench located closest to the IGBT trench; and in the communication trench, an insulation film that insulates the first gate electrode and the second gate electrode is arranged.

* * * * *